United States Patent
Nakamura

(10) Patent No.: US 8,194,161 B2
(45) Date of Patent: Jun. 5, 2012

(54) PHOTODIODE ARRAY AND SIGNAL READOUT METHOD FOR THE SAME

(75) Inventor: Takafumi Nakamura, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 507 days.

(21) Appl. No.: 12/422,700

(22) Filed: Apr. 13, 2009

(65) Prior Publication Data
US 2009/0262227 A1    Oct. 22, 2009

(30) Foreign Application Priority Data
Apr. 21, 2008   (JP) ................................ 2008-109882

(51) Int. Cl.
*H04N 3/14* (2006.01)
(52) U.S. Cl. ................. 348/294; 250/208.1; 250/214 R; 356/326
(58) Field of Classification Search ................. 348/294, 348/297, 308, 310; 250/206, 208.1, 208.2, 250/208.3, 214 R, 214.1, 226; 356/319, 356/326, 328
See application file for complete search history.

(56) References Cited

U.S. PATENT DOCUMENTS

| 4,308,456 A * | 12/1981 | Van Der Gaag et al. ...... 250/226 |
| 7,800,791 B2 * | 9/2010 | Kageyama et al. ........... 358/474 |
| 2006/0231745 A1 * | 10/2006 | Bodano et al. ............. 250/214 R |
| 2007/0158533 A1 * | 7/2007 | Bamji et al. ............... 250/208.1 |

FOREIGN PATENT DOCUMENTS

| JP | 08-015013 A | 1/1996 |
| JP | 08-122150 A | 5/1996 |
| JP | 2564792 Y2 | 3/1998 |
| JP | 2008-070274 A | 3/2008 |

OTHER PUBLICATIONS

Japanese Office Action dated Feb. 21, 2012, issued in corresponding Japanese Patent Application No. 2008-109982.

* cited by examiner

Primary Examiner — Huy K Mai
(74) Attorney, Agent, or Firm — Sughrue Mion, PLLC

(57) ABSTRACT

An easy and inexpensive signal readout method is provided for a photodiode array consisting of n pieces of photodiodes whose signals are sequentially read out from the first through nth photodiodes. The method includes a canceling process that is performed one or more times before performing a complete readout operation for sequentially reading out signals from all the photodiodes, and the canceling process includes the steps of sequentially reading out signals of a predetermined number of photodiodes starting from the first photodiode to cancel the signals of these photodiodes and then returning to the readout of the signal of the first photodiode. According to this method, it is possible to easily set an appropriate charging time for each photodiode and yet prevent the photodiodes from becoming saturated.

16 Claims, 3 Drawing Sheets

(a)

(b)

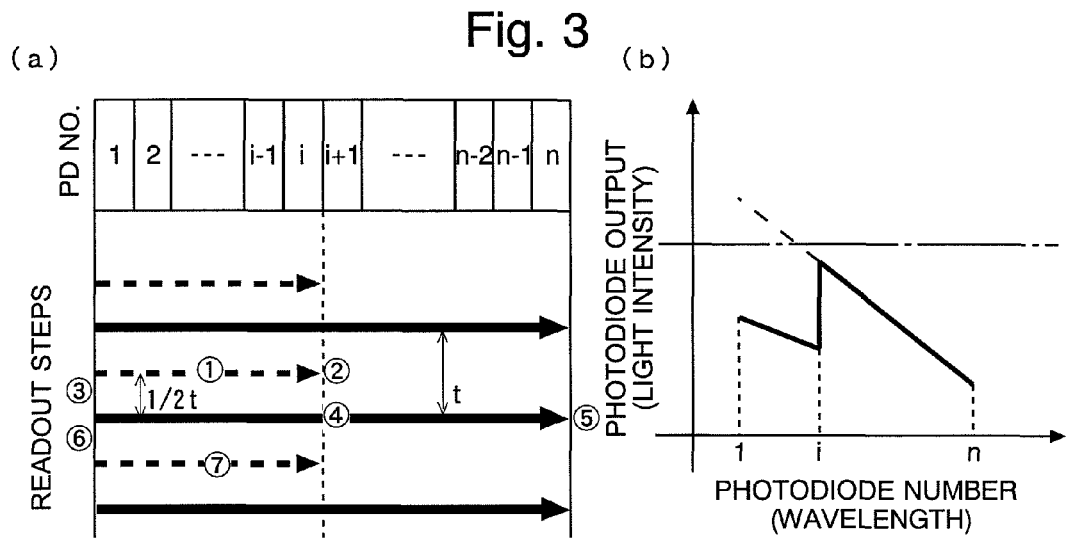
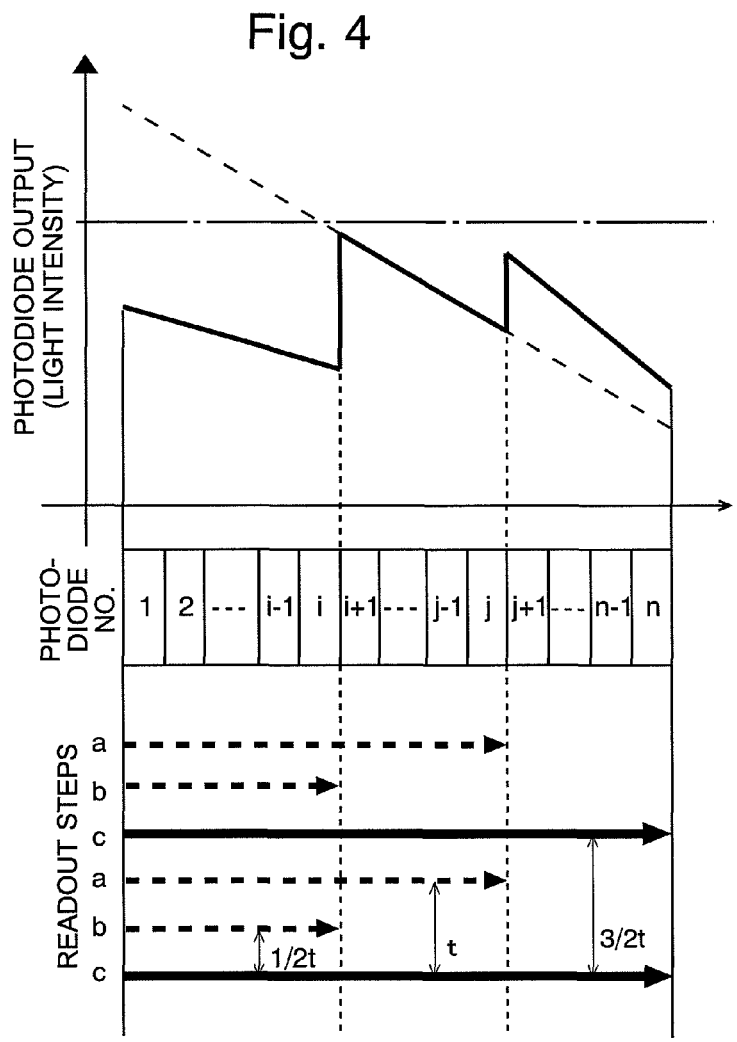

PHOTODIODE ARRAY AND SIGNAL READOUT METHOD FOR THE SAME

The present invention relates to a photodiode array created by arranging a plurality of photodiodes. The present invention also relates to a signal readout method for a photodiode array.

BACKGROUND OF THE INVENTION

Photodiode arrays are generally used as a photodetector in a spectrophotometer or other apparatuses since they are capable of collectively receiving a spectrum of light dispersed by a diffraction grating or similar device, thus almost simultaneously detecting the intensity of light over a wide range of wavelengths.

In a photodiode array, each photodiode generates a current, voltage or another form of signal corresponding to the intensity of light falling on it. The signals of the photodiodes are then sequentially read out and processed one after another by a signal-processing circuit. There are two major methods for separately reading out signals from the photodiodes: the real-time readout method and the storage readout method.

In the real-time readout method, one amplifier is provided for each photodiode, and the photodiodes are connected to the signal-processing circuit via a multiplexer. This system can selectively read out a photocurrent generated in each photodiode as a result of illumination with light. However, this system has a drawback in that its signal-to-noise (S/N) ratio is difficult to increase since the signal intensity depends exclusively on the intensity of the incident light. Therefore, if the light intensity is low, it is necessary to amplify the signal by an operational amplifier.

In the storage readout method, the value of the read signal is proportional to the product of the light intensity and the illumination time of the photodiode. FIG. 1(a) is a circuit diagram of a storage readout system, showing the section from the photodiodes 11 to the signal-processing circuit 15. Before an illumination with light, a specific amount of electric charge is stored in the photodiode (PD) junction capacitor 12, as indicated by the chained line in FIG. 1(b). When illuminated with light, the photodiode 11 generates a photocurrent, which causes the electric charge to be discharged from the PD junction capacitor 12, thus decreasing the amount of the stored electric charge. Subsequently, the PD junction capacitor 12 is connected via the multiplexer 14 to the signal-processing circuit 15 so that the same circuit 15 can read the reduced amount of the electric charge remaining in the PD junction capacitor 12. Simultaneously, the PD junction capacitor 12 is charged to the level of the junction capacitance, i.e. to the level indicated by the chained line in FIG. 1(b). After the connection to the signal-processing circuit 15 is terminated by the multiplexer 14, the stored electric charge is discharged once more from the PD junction capacitor 12 due to the photocurrent until the next cycle of readout operation (i.e. during the readout period). In other words, the readout period corresponds to the period of time for the PD junction capacitor 12 to be discharged, and the read signal is proportional to the product of the light intensity and the readout period. This means that, in the storage readout system, a sufficiently strong signal can be produced by increasing the readout time if the light intensity is low.

The present invention specifically relates to a photodiode array that reads out signals by a storage readout method. Accordingly, the following description presumes the use of the storage readout method.

In actual cases, the operation of reading out signals from the photodiode array is performed by the sequential access method, in which a signal is read out from each photodiode in a predetermined order (e.g. from shorter to longer wavelengths). This method generally uses shift registers.

The photodiode has a limited junction capacitance. Therefore, when illuminated with light for a long period of time, the PD junction capacitance will be saturated, as shown in FIG. 1(c). This problem must be considered in the sequential access method. For example, in the case where the light intensity is higher at one wavelength and lower at another, if the readout period is set longer to ensure an adequate length of time for the detection of the low-intensity light, a photocurrent in excess of the junction capacitance will flow in a photodiode receiving light at a wavelength where the light intensity is high, and eventually saturate the capacitance. A saturated device cannot serve as a detector since its signal can no longer show any readable change.

Conversely, selecting a shorter readout period to prevent the saturation decreases the amount of electric charge discharged from the photodiode corresponding to the wavelength where the light intensity is low, only to produce a faint output signal and hence decrease the S/N ratio of the measurement. Therefore, unnecessary shortening of the readout period should be avoided to ensure a high level of measurement accuracy.

Thus, in the sequential access method, it is crucial to appropriately specify the readout period for each photodiode. However, no satisfactory solution has been found to the tradeoff problem between the prevention of saturation of the photodiode and the improvement of the S/N ratio.

One conceivable method for solving the aforementioned problem is to control the signal readout operation so that the photodiodes will be accessed in descending order of the intensity of light falling on them before each photodiode is saturated. For example, the Japanese Unexamined Patent Application Publication No. H08-015013 discloses a device with a control circuit for independently controlling individual photodiodes, thus allowing the readout period to be independently specified for each photodiode based on the measured value of the background spectrum. However, this method also has several problems: For example, increasing the number of photodiodes requires more complex scheduling for reading out signals from all the photodiodes without changing the readout period for each photodiode. Another problem exists in that this method requires a randomly accessible photodiode array, which is expensive and hence unfavorable when considering the issue of cost reduction.

A technique aimed at solving the aforementioned problems within the framework of the sequential access method is disclosed in the Gazette of Japanese Utility Model Registration No. 2564792, in which an attenuation filter is provided for only the photodiodes that cover the wavelength range where the light intensity is high. Another method is shown in Japanese Unexamined Patent Application Publication No. H08-122150, which includes specifying a limited wavelength range for the measurement and automatically selecting an appropriate charging time for the specified wavelength range.

These techniques also have other problems to be solved, such as the instability of incident light falling on the photodiodes located at the boundary of the attenuation filter or the inability to perform the measurement over a wide wavelength range.

The shortest possible readout period is determined by the period of time required for the analyzing apparatus to read out signals from a single photodiode and the number of photodiodes constituting the photodiode array. Therefore, in the case of using a processor (e.g. a signal-processing circuit) with a low processing capability or a photodiode array with a large area, some of the photodiodes may be saturated even if the shortest readout period is set at the smallest value.

The discussions on the problems and measures described so far are also applicable to an opposite type of photodiode which will be charged when the photocurrent flows.

The present invention is aimed at providing a photodiode array adopting a storage readout method, which is capable of easily setting an appropriate charging time for each photodiode yet preventing the photodiodes from saturation. The present invention is also aimed at providing a signal readout method for a photodiode array.

SUMMARY OF THE INVENTION

To achieve the aforementioned objective, the present invention provides a photodiode array with n pieces of photodiodes whose signals are sequentially read out from the first through nth photodiodes. This photodiode array includes a readout controller for performing a canceling process one or more times before performing a complete readout operation for sequentially reading out signals from all the photodiodes, and the canceling process includes the steps of sequentially reading out signals of a predetermined number of photodiodes starting from the first photodiode to cancel the signals of these photodiodes and then returning to the readout of the signal of the first photodiode.

The present invention also provides a method for reading out signals from a photodiode array with n pieces of photodiodes whose signals are sequentially read out from the first through nth photodiodes. This method is characterized in that a canceling process is performed one or more times before a complete readout operation for sequentially reading out signals from all the photodiodes is performed, and the canceling process includes the steps of sequentially reading out signals of a predetermined number of photodiodes starting from the first photodiode to cancel the signals of these photodiodes and then returning to the readout of the signal of the first photodiode.

In the photodiode array and the signal readout method for a photodiode array according to the present invention, an appropriate period can be set for each photodiode of the photodiode array by a simple configuration so that the output signals can be maintained at high levels within a range where none of the photodiodes are saturated. This results in a better S/N ratio and higher measurement accuracy.

Furthermore, the photodiode array and the signal readout method for a photodiode array according to the present invention are significantly advantageous for cost reduction since they basically allow the use of a conventional type of photodiode array.

If, for example, the capability of the apparatus is too low to shorten the readout period, it is possible to use the photodiode array or the signal readout method for a photodiode array according to the present invention to prevent the photodiodes from becoming saturated without improving the capability of the analyzing apparatus.

BRIEF DESCRIPTION OF THE DRAWINGS

FIG. 3(a) is a conceptual diagram illustrating a readout method with a canceling process performed one time. FIG. 3(b) is a graph showing the result of a measurement performed by the method of FIG. 3(a).

FIG. 4 is a conceptual diagram illustrating a readout method with a canceling process performed one time, and a graph showing the result of a measurement performed by the same method.

DETAILED DESCRIPTION OF PREFERRED EMBODIMENTS

Figure 1:
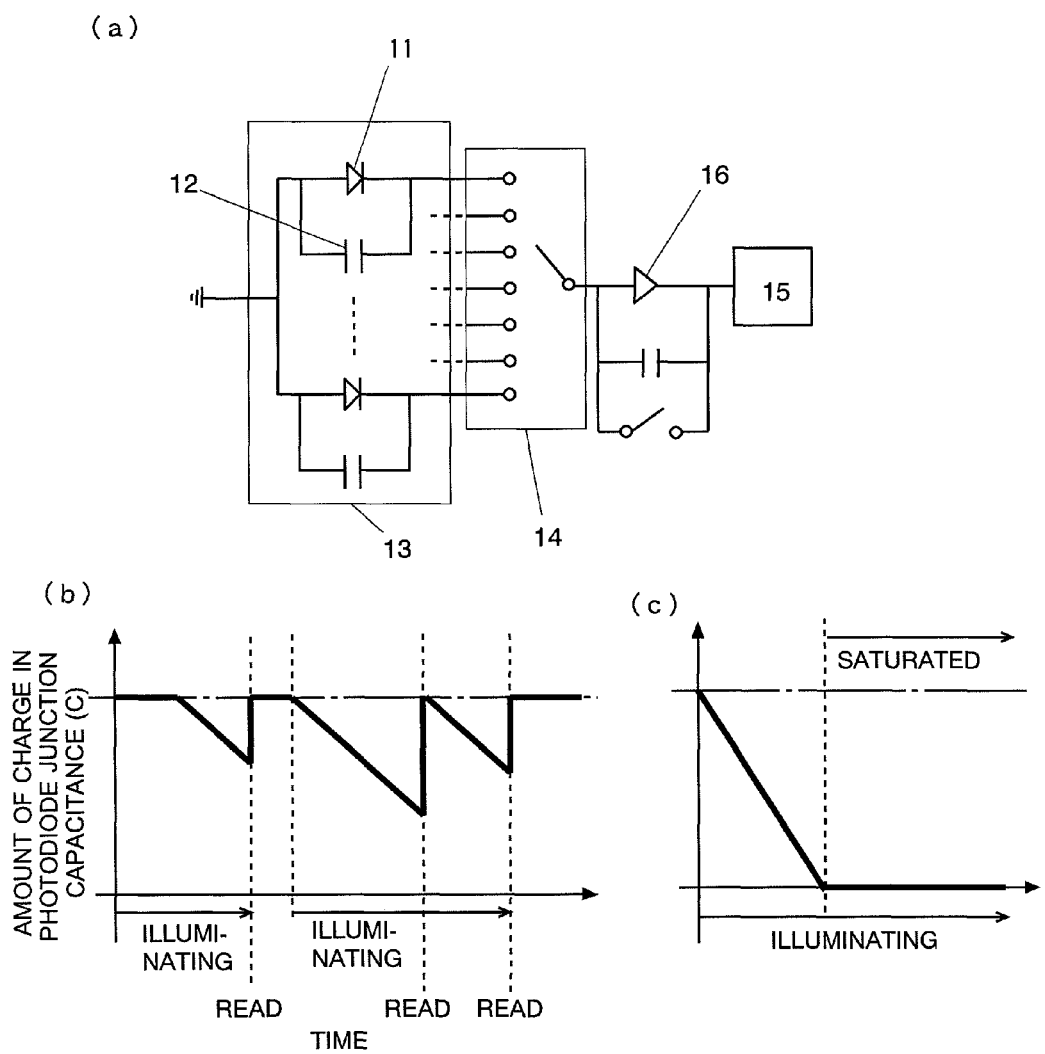
FIG. 1(a) is a circuit diagram of a storage readout system, showing the section from the photodiodes to the signal-processing circuit.
FIG. 1(b) is a graph roughly showing a change in the amount of electric charges in a PD junction capacitor illuminated with light.
FIG. 1(c) is a graph roughly showing the saturated state of a PD junction capacitor illuminated with light.

The signal readout method for a photodiode array according to the present invention is hereinafter described in detail by means of specific examples. The readout controller of the photodiode array according to the present invention can be realized by using especially designed circuits and other components; there is no limitation to its actual configuration.

The photodiode array according to the present invention includes a total of n pieces of photodiodes, which are one-dimensionally arrayed from the first through nth photodiodes. Its basic configuration is identical to those of conventional photodiode arrays. The operation of reading out signals of the photodiodes in the present embodiment is performed by a sequential access method: The signals are sequentially read out from the first through nth photodiodes. The "signals of the photodiodes" may be electric charges, voltages or any other type of signal. The following description assumes that they are electric charges.

In the photodiode array according to the present invention, it is basically preferable to orient the photodiode array to the incident light so that the light intensity increases in the direction from the nth photodiode to the first photodiode. However, the present invention assigns no specific limitations to the orientation of the photodiode array.

Now, imagine that a light beam dispersed by a diffraction grating (not shown) is falling on the photodiode array, with the light intensity linearly decreasing from shorter to longer wavelengths. The following example assumes that the first photodiode receives the light having the shortest wavelength, and the nth photodiode receives the light having the longest wavelength. FIG. 2(a) is a graph roughly showing the result of a measurement performed under ideal conditions (i.e. no limitation to the capacitance of the photodiode) with the readout period set at t.

FIG. 2(b) shows the result of a measurement performed by a conventional method. The chained line indicates the output level that results if electric charges have been discharged by an amount equal to the junction capacitance of the photodiode. (This amount is hereinafter called the "charge saturation amount.") As shown in FIG. 2(b), the conventional method allowed the discharged amount of electric charge to exceed the charge saturation amount within a short-wavelength range and cause a saturated state in which the output value of the light intensity is lower than the actual value. FIG. 2(c) shows the result of another measurement in which the readout period was shortened, or specifically, halved to $(\frac{1}{2})t$ to prevent the saturation. As a result, the discharged amount of electric charge was decreased below the charge saturation amount over the entire wavelength range, whereby the aforementioned saturation within the short-wavelength range was prevented. However, the shortened readout period also suppressed the entire output level and accordingly deteriorated the S/N ratio.

FIG. 3(a) schematically illustrates the signal readout method according to the present invention. This method specifically involves the following steps:

(S1) Reading out the signals of the first through ith photodiodes. This operation cancels the signals of the first through ith photodiodes.
(S2) Erasing or storing the obtained signal of each photodiode.
(S3) Waiting for $(\frac{1}{2})t$ to elapse.
(S4) Reading out the signals of the first through nth photodiodes. This means that the complete readout operation is performed.
(S5) Adopting the signals obtained by the complete readout operation in S4 as the light intensities.
(S6) Waiting for $(\frac{1}{2})t$ to elapse.
(S7) Returning to S1.

In summary, the photodiode array and the signal readout method for a photodiode array according to the present invention perform a canceling process before performing a complete readout operation for sequentially reading out signals from all the photodiodes, the canceling process including the steps of sequentially reading out signals of a predetermined number of photodiodes starting from the first photodiode to cancel the signals of these photodiodes and then returning to the readout of the signal of the first photodiode.

The number i of the photodiodes to be covered by the readout operation in the canceling process should be previously determined taking into account the characteristics of the incident light. It should also be noted that in the present example S1 and S2 correspond to the canceling process.

A measurement performed by the previously described steps produces a result similar to the one obtained by performing the measurement with the readout period set at $(\frac{1}{2})t$ for the first through ith photodiodes and t for the i+1st through nth photodiodes. Specifically, the result will be as shown in FIG. 3(b), which demonstrates that the photodiodes is prevented from becoming saturated yet the output signals within the high wavelength range are maintained at high levels. Thus, both the maintenance of S/N ratio and the prevention of photodiode saturation are simultaneously achieved. The signals of the first through ith photodiodes obtained in S2 may be immediately erased or temporarily retained for later use. For example, the retained signals can be added to the signals of the first through ith photodiodes collected in S4, to obtain a result as indicated by the long dashed line in FIG. 3. This line is identical to FIG. 2(a) showing "the output of an ideal, saturation-free photodiode array", and its S/N ratio equals the ideal level.

Taking into account the characteristics of the incident light, it is possible to perform the canceling process multiple times before the complete readout operation. The multiple cycles of canceling process should normally be performed so that the number of photodiodes to be subjected to the canceling process is decreased as the process goes from one cycle to the next.

In the previous example, if the output signals within a long-wavelength range need to be amplified, the signal readout process can involve the following steps:

(a) Reading out the signals of the first through jth photodiodes. (First canceling process)
(b) Reading out the signals of the first through ith photodiodes, where i<j. (Second canceling process)
(c) Reading out the signals of the first through nth photodiodes. (Complete readout operation)
(d) Returning to Step (a).

Additionally, it should be noted that a waiting period of $(\frac{1}{2})t$ is interposed between the readout processes.

The signals obtained in Step (c) are adopted as the output signals; the signals obtained in Steps (a) and (b) may be immediately erased or temporarily retained for later use.

As a result of the two canceling processes, the signals obtained by the complete readout operation will consist of the signals of the first through ith photodiodes measured with readout period $(\frac{1}{2})t$, the signals of the i+1st through jth photodiodes measured with readout period t, and the signals of the j+1st through nth photodiodes measured with readout period $(3/2)t$.

The result of a measurement performed by the previously described steps is also shown in the upper section of FIG. 4. Compared to the case where the canceling process was performed only once, the S/N ratio was further improved due to the increased output level within the long-wavelength range. If the first through jth signals obtained in Step (a) and the first through ith signals obtained in Step (b) are retained, these two sets of signals can be respectively added to the first through jth signals and the first through ith signals obtained in Step (c), to obtain a result as indicated by the long dashed line in FIG. 4. This result is identical to that obtained with the ideal, saturation-free photodiode array, and its S/N ratio equals the ideal level.

In the photodiode array and the signal readout method for a photodiode array according to the present invention, the waiting time between the completion of each canceling process and either the next cycle of canceling process or the complete readout operation can be arbitrarily set and not limited to specific values.

In the case of actually reading out the signals from the photodiodes, there is the shortest possible readout period available. Use of the shortest readout period does not always prevent the photodiodes from becoming saturated. One solution to this problem is to increase the processing capability of the processor (e.g. the signal-processing circuit). However, this solution requires a considerable amount of time and labor. In such a case, the photodiode array and the signal readout method for a photodiode array according to the present invention can in some cases provide a solution without relying on the processing power of the apparatus. One example is hereinafter described.

For example, consider the case of using a photodiode array consisting of 200 pieces of photodiodes and which requires 1 msec to read out a signal from each photodiode. In this case, the shortest possible readout period is 200 msec. Now, it is assumed that driving this device with the shortest possible readout period of 200 msec has yielded the output signals shown in the upper section of FIG. 5(a). According to this figure, the signals of the first through ith photodiodes exceed 100, i.e. the saturation level, whereas the signals of the i+1st through the two-hundredth photodiode are below the saturation level.

Figure 5:
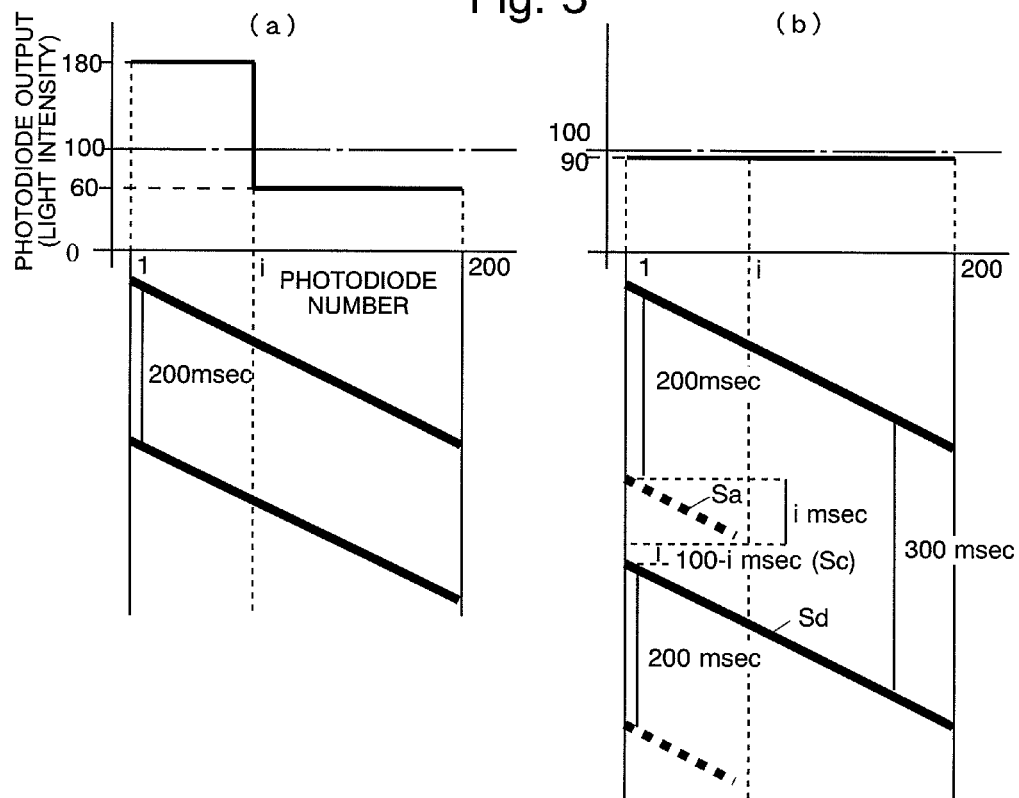
FIG. 5 illustrates (a) a conventional measurement process, compared with (b) a measurement process according to an embodiment of the present invention.

Next, consider the case of driving the same device by the following steps. These steps are also illustrated in FIG. 5(b).
(Sa) Reading out the signals of the first through ith photodiodes (i msec).
(Sb) Erasing or storing the obtained signals.
(Sc) Waiting for 100–i msec to elapse.
(Sd) Reading out the signals of the first through two-hundredth photodiodes (200 msec).
(Se) Adopting the obtained signals as the light intensities.
(Sf) Returning to Sa.

In Step Se, the signals of the first through ith photodiodes correspond to the electric charges discharged from these photodiodes during 100 msec, whereas, for the i+1st through two-hundredth photodiodes, the electric charges discharged during 300 msec are collected as the output signals. Even if the photodiode array includes such photodiodes that will be saturated if the discharging is continued for 200 msec, the saturation can be prevented by selecting a much shorter period of 100 msec, as shown in FIG. 5(b) above. Simultaneously, the output level within the positional range of the i+1 through two-hundredth photodiodes is increased due to the increase in the readout period within this range.

Figure 6:
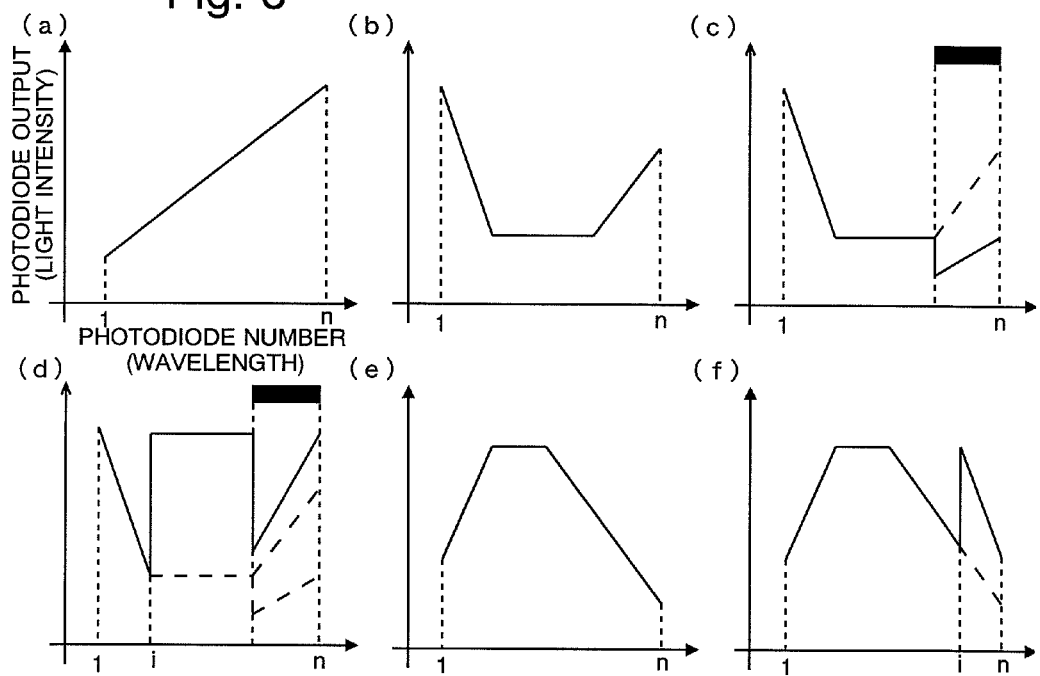
FIG. 6(a) is a graph showing a relationship between the light intensity and the photodiode number (or wavelength) in the case where the light intensity increases from shorter to longer wavelengths.
FIG. 6(b) is a graph showing a relationship between the light intensity and the photodiode number (or wavelength) in the case where the light intensity is higher within short and long wavelength ranges and lower within a middle wavelength range.
FIG. 6(c) is a graph showing a measured result of FIG. 6(b) with a filter applied thereto.
FIG. 6(d) is a graph showing a measured result of FIG. 6(c) with the present invention applied thereto.
FIG. 6(e) is a graph showing a relationship between the light intensity and the photodiode number (or wavelength) in the case where the light intensity is lower within short and long wavelength ranges and higher within a middle wavelength range.
FIG. 6(f) is a graph showing a measured result of FIG. 6(e) with the present invention applied thereto.

The photodiode array and the signal readout method for a photodiode array according to the present invention are applicable to not only the spectrums having the previously described form but also various forms of spectrums. FIG. 6 shows a few examples in which the present invention is applied to different forms of spectrums.

Figure 2:
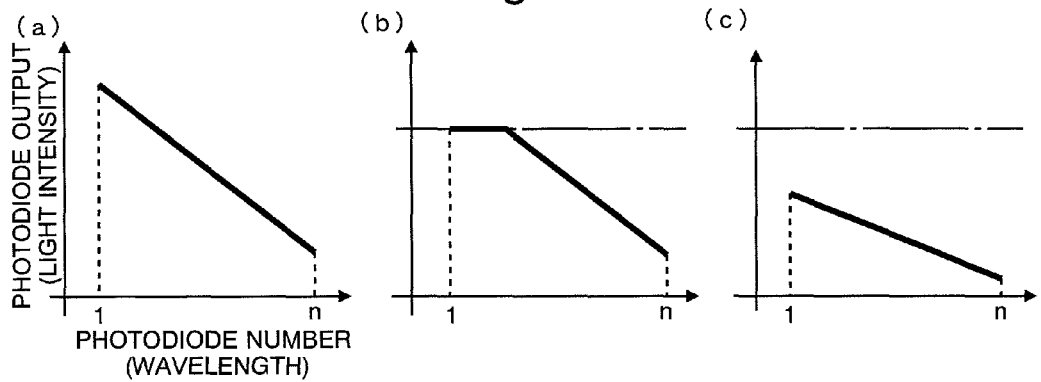
FIG. 2(a) is a graph showing a measured result of a conventional photodiode array under ideal conditions.
FIG. 2(b) a graph showing a measured result of a conventional photodiode array in the case where the output was saturated within a short-wavelength range.
FIG. 2(c) is a graph showing a measured result of a conventional photodiode array in the case where the output level is low over the entire wavelength range.

FIG. 6(a) is the case where the light intensity increases in the direction from shorter to longer wavelengths. In this case, the photodiode array can be physically reversed so that the nth photodiode will receive light on the short-wavelength side and the first photodiode on the long-wavelength side. This positioning creates substantially the same situation as shown in FIG. 2 and therefore allows the multiple setting of the charging time in a similar manner.

FIG. 6(a) is the case where the light intensity is higher within short and long wavelength ranges and lower within a middle wavelength range. In this case, the output signals within the long-wavelength range can be modified as shown in FIG. 6(c) by using a filter to cover the photodiodes receiving the light within the long-wavelength range, as described in the aforementioned Gazette of Japanese Utility Model Registration No. 2564792. The thick belt in FIG. 6(c) indicates the range covered by the filter. The use of the filter creates substantially the same situation as shown in FIG. 2 and therefore allows the multiple setting of the charging time in a similar manner. The resultant output signals will be as indicated by the solid line in FIG. 6(d).

The example shown in FIG. 6(e) is the case where the light intensity is lower within short and long wavelength ranges and higher within a middle wavelength range. In this case, the output level within the long-wavelength range can be modified by performing the canceling process for the first through ith photodiodes as shown in FIG. 6(f), although the output level within the short-wavelength range cannot be increased by this method.

The previously described embodiments are mere examples and do not limit the scope of the present invention. For example, in the case of an absorptiometer having a light source whose spectrum intensity significantly changes depending on the wavelength range, it is possible to control the readout period with reference to either the background spectrum or the original spectrum of the light source so that the measurement can also be performed with high S/N ratios within the wavelength range where the light intensity is low.

The present invention is applicable in a wide range of technical fields and not limited to specific applications, yet is particularly suitable for spectrophotometers. It can also be applied in various kinds of imaging techniques. One application example is an image scanner using a photodiode array as an image sensor. Use of a photodiode array or a signal readout method for a photodiode array according to the present invention will enable the scanner to achieve the task with high S/N ratios when, for example, the image to be acquired has a gradation or similar shading pattern along a specific direction.

What is claimed is:

1. A photodiode array system including n pieces of photodiodes and a readout controller for sequentially reading out signals of the photodiodes from the first through nth photodiodes, the readout controller comprising:
    a) a partial read out section for reading out signals of a predetermined number of photodiodes starting from the first photodiode, whereby the signals of the predetermined number of photodiodes are canceled, the predetermined number being less than n; and
    b) a complete read out section for reading out signals of the n pieces of photodiodes after the signals of the predetermined number of photodiodes are canceled.

2. The photodiode array according to claim 1, wherein, in a case of performing more than one cycle of the canceling process, the readout controller decreases a number of photodiodes to be subjected to the canceling process as the process goes from one cycle to the next.

3. The photodiode array according to claim 2, wherein the readout controller sets a predetermined waiting time between a completion of each canceling process and either the next cycle of canceling process or the complete readout operation.

4. A spectrophotometer, comprising a photodiode array according to claim 3.

5. A spectrophotometer, comprising a photodiode array according to claim 2.

6. The photodiode array according to claim 1, wherein the readout controller sets a predetermined waiting time between a completion of each canceling process and either the next cycle of canceling process or the complete readout operation.

7. A spectrophotometer, comprising a photodiode array according to claim 6.

8. A spectrophotometer, comprising a photodiode array according to claim 1.

9. A method of reading out signals from a photodiode array including n pieces of photodiodes the method comprising:
    a) reading out signals of a predetermined number of photodiodes starting from the first photodiode, whereby the signals of the predetermined number of photodiodes are canceled, the predetermined number being less than n; and
    b) reading out signals of n pieces of photodiodes starting from the first photodiode after the step of reading signals of the predetermined number of photodiodes being canceled.

10. The method for reading out signals from a photodiode array according to claim 9, wherein, in a case of performing more than one cycle of the canceling process, a number of photodiodes to be subjected to the canceling process is decreased as the process goes from one cycle to the next.

11. The method for reading out signals from a photodiode array according to claim 10, wherein a predetermined waiting time is set between a completion of each canceling process and either the next cycle of canceling process or the complete readout operation.

12. The method for reading out signals from a photodiode array according to claim 11, wherein the signals of the predetermined number of photodiodes obtained in each canceling process are retained for later use.

13. The method for reading out signals from a photodiode array according to claim 10, wherein the signals of the predetermined number of photodiodes obtained in each canceling process are retained for later use.

14. The method for reading out signals from a photodiode array according to claim 9, wherein a predetermined waiting time is set between a completion of each canceling process and either the next cycle of canceling process or the complete readout operation.

15. The method for reading out signals from a photodiode array according to claim 14, wherein the signals of the predetermined number of photodiodes obtained in each canceling process are retained for later use.

16. The method for reading out signals from a photodiode array according to claim 9, wherein the signals of the predetermined number of photodiodes obtained in each canceling process are retained for later use.

* * * * *